(12) United States Patent
Hiraga

(10) Patent No.: US 6,191,491 B1
(45) Date of Patent: *Feb. 20, 2001

(54) SEMICONDUCTOR INTEGRATED CIRCUIT DEVICE

(75) Inventor: Noriaki Hiraga, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/175,454

(22) Filed: Oct. 20, 1998

(30) Foreign Application Priority Data

Oct. 20, 1997 (JP) .................................................. 9-287079

(51) Int. Cl.[7] .......................... H01L 23/48; H01L 23/52; H01L 29/40

(52) U.S. Cl. ......................... 257/784; 257/786; 257/773; 257/760; 257/674; 257/668; 257/676; 361/777

(58) Field of Search .................................... 257/786, 784, 257/773, 760, 674, 668, 676; 361/777; 438/617

(56) References Cited

U.S. PATENT DOCUMENTS

| | | | |
|---|---|---|---|
| 5,767,575 | * | 6/1998 | Lan et al. .............................. 257/701 |
| 5,796,171 | * | 8/1998 | Koc et al. ............................. 257/786 |
| 5,814,892 | * | 9/1998 | Steidl et al. .......................... 257/784 |

* cited by examiner

Primary Examiner—Tom Thomas
Assistant Examiner—Luan Thai
(74) Attorney, Agent, or Firm—Arent Fox Kintner Plotkin & Kahn

(57) ABSTRACT

A semiconductor integrated circuit device has a semiconductor chip having a plurality of input/output circuits and input/output pads connected individually thereto by metal conductors, and also has a frame on which the semiconductor chip is mounted. The pads of the semiconductor chip and a plurality of inner leads arranged on the frame are connected by wires that are wire-bonded thereto. The pads are arranged in two rows along each edge of the semiconductor chip. In the outer row, the pads are grouped into groups each consisting of pads arranged as close as possible to one another; spaces are secured between those groups and wires are arranged through those spaces. In the inner row, the pads are arranged in such positions where they can be connected to the wires arranged through the spaces secured between the groups of pads.

2 Claims, 8 Drawing Sheets

SEMICONDUCTOR INTEGRATED CIRCUIT DEVICE

BACKGROUND OF THE INVENTION

1. Field of the Invention

The present invention relates to a semiconductor integrated circuit device, and more particularly to a semiconductor integrated circuit device in which the input/output pads of a semiconductor chip and the inner leads of the frame on which the semiconductor chip is mounted are connected electrically by wire bonding or the like.

2. Description of the Prior Art

A typical semiconductor chip has a plurality of input/output pads formed along its edges. In a semiconductor integrated circuit device, those input/output pads and the inner leads arranged on the frame on which the semiconductor chip is mounted are connected electrically, for example, by wire bonding, and this enables the semiconductor chip to communicate electrically with circuits and components arranged outside the package of the semiconductor integrated circuit device.

As shown in FIG. 5, in some conventional semiconductor chips, input/output circuits 42 are arranged in a row along each edge of the semiconductor chip 1, and input/output pads 43 and 44 are arranged in two rows that sandwich the row of input/output circuits 42 from the chip-edge and chip-center sides thereof, with the input/output pads 43 and 44 arranged at regular intervals within each row. This type of pad arrangement is referred to as the "staggered" arrangement in the following description.

As shown in FIG. 9, the semiconductor chip 1 is mounted, by die bonding or the like, on a stage 21 formed on a frame 24. The stage 21 is formed as an island that is supported by support bars 22 at its corners. In each of those areas of the frame 24 which exist between two adjacent support bars 22, a number of inner leads 23 are arranged so as to extend radially.

In this way, for each edge of the semiconductor chip 1, the inner leads 23 are arranged in an area wider than the area in which the input/output pads are arranged. The input/output pads and the inner leads 23 are connected by way of wires 3 (only partially shown in the figure) that are, for example, wire-bonded thereto.

Here, as shown in FIG. 6, to prevent contact between a wire 3f coming from a pad 43 arranged in a chip-center-side (inner) row and a wire 3g coming from a pad 44 arranged in a chip-edge-side (outer) row, the wires 3 are arranged in two, i.e. an upper and a lower, layers. This is the reason that, in the plan view shown in FIG. 9, some wires from pads in an inner row appear to intersect wires from pads in an outer row as indicated at 60, but actually this is not the case.

As shown in FIG. 7, in other conventional semiconductor chips, input/output pads 45 are arranged in one row along each edge of the semiconductor chip 1. In this type of semiconductor chip 1, the input/output pads 45 are connected to input/output circuits 42 by way of a fan-like pattern of metal conductors 51 extending from the input/output circuit 42.

In addition, as shown in FIG. 8, the wires 3h connecting the input/output pads 45 to inner leads 23 are arranged in one layer. Accordingly, in this case, apparent intersection between wires as observed at 60 in FIG. 9 never occurs. Note that, in FIGS. 5 and 7, reference numeral 50 represents conductor layers that are laid over the input/output circuits 42 so as to serve as power-source and ground conductors.

In the former "staggered" arrangement (see FIG. 5), the wires are arranged in two layers as shown in FIG. 6. This inevitably requires that the semiconductor integrated circuit device have a thicker package. This is disadvantageous because a semiconductor integrated circuit device with a thick package is not fit for use in a small-size appliance such as a portable telephone.

On the other hand, in the latter "one-row" arrangement in which the input/output pads are arranged in one row (see FIG. 7), the current wire bonding technique requires that the interval s between two adjacent pads 45 be greater than the width t of each input/output circuit 42. This means that, as long as the pads 45 are arranged in one row, the minimum size of the entire semiconductor chip 1 depends on the total number of pads 45 that are arranged thereon and the intervals. This imposes a limit to the maximum number of pads that can be arranged on a semiconductor chip of a given chip size, and thus it has been impossible to arrange a large number of pads without accordingly increasing the chip size.

SUMMARY OF THE INVENTION

An object of the present invention is to provide a semiconductor integrated circuit device in which a larger number of input/output pads than ever can be arranged on a semiconductor chip of a given chip size without increasing the thickness of the package of the semiconductor integrated circuit device.

To achieve the above object, according to one aspect of the present invention, a semiconductor integrated circuit device is provided with: a plurality of input/output circuits arranged to form a row of input/output circuits along each edge of a semiconductor chip; and input/output pads arranged between the row of input/output circuits and the edge of the semiconductor chip to form a first and a in second row of input/output pads. The first row of input/output pads is located beside the edge of the semiconductor chip, and the second row of input/output pads is located beside the row of input/output circuits. The input/output pads of the first and second rows of input/output pads are connected to the input/output circuits. Moreover, in the first row of input/output pads, the input/output pads are grouped into groups each consisting of a plurality of input/output pads, with those groups arranged with spaces between them so that wires can be arranged through those spaces, and, in the second row of input/output pads, the input/output pads are arranged in such positions where they are connected to the wires arranged through those spaces.

In this layout, in the chip-edge-side row, the input/output pads are so arranged as to be grouped into groups each consisting of, for example, two input/output pads. Between those groups, spaces are secured, and, through those spaces, wires are arranged. The input/output pads that are connected to the wires arranged through those spaces are arranged in the chip-center-side row. In this way, the input/output pads are arranged in two rows, and this helps reduce the chip size as compared with the case where they are arranged in one row. Moreover, this layout allows wires to be arranged through the spaces secured between the groups of input/output pads. This makes it possible to arrange the wires in one layer and thereby eliminate the need to increase the thickness of the package.

In the layout described above, those of the groups of input/output pads which are located near a corner of the semiconductor chip may include a larger number of input/output pads than those which are located away from a corner of the semiconductor chip.

In this layout, the conductors connecting the output buffers of the input/output circuits to the corresponding input/output pads are longer near a corner of the semiconductor chip than elsewhere, because such conductors are so arranged as to extend in a fan-shaped pattern. By arranging the input/output pads in one row near a corner, it is possible to secure an ample space for such conductors and thereby reduce the chip size.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
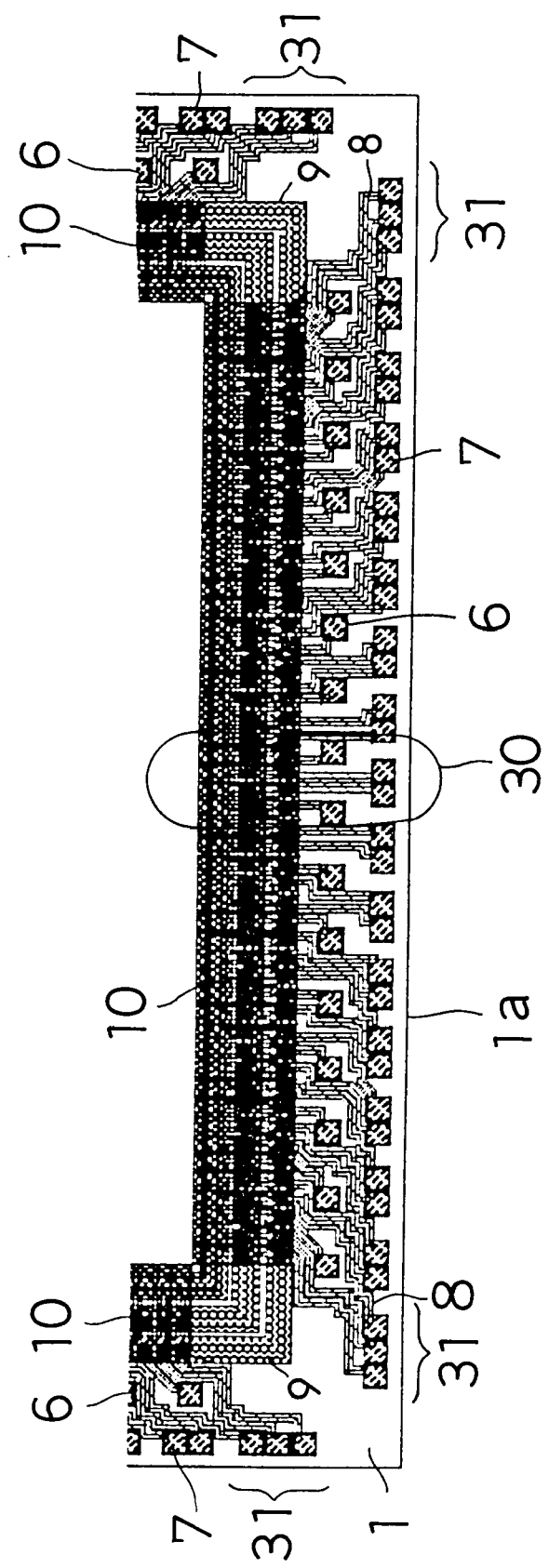
FIG. 1 is a plan view of a relevant portion of the semiconductor chip employed in a semiconductor integrated circuit device embodying the present

Hereinafter, embodiments of the present invention will be described with reference to the drawings. FIG. 1 is a partial plan view illustrating how input/output circuits and input/output pads are arranged on a semiconductor chip in a semiconductor integrated circuit device embodying the present invention.

Figure 9:
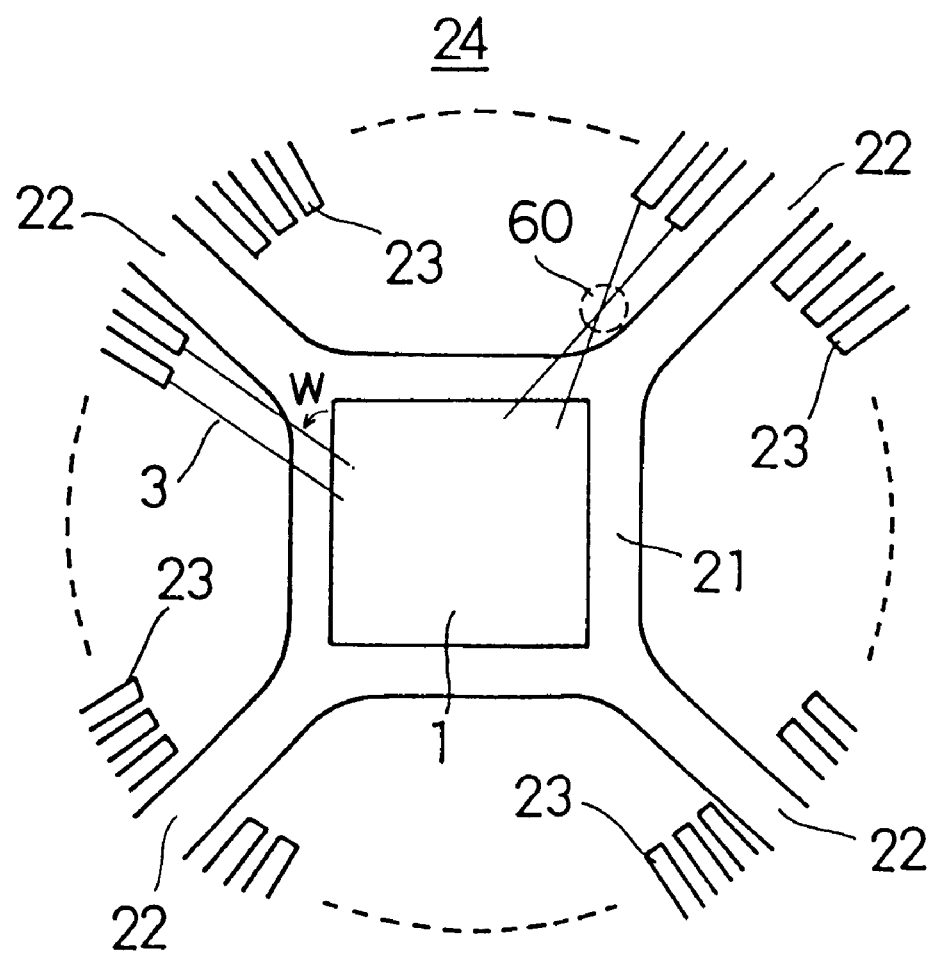
FIG. 9 is a diagram illustrating how the inner leads are arranged radially on the frame.

In this embodiment, just as in the conventional semiconductor integrated circuit device shown in FIG. 9, the semiconductor chip 1 is mounted, by die bonding or the like, on a stage 21 formed on a frame 24, and inner leads 23 are so arranged as to extend radially.

As shown in FIG. 1, along each edge of the semiconductor chip 1, input/output circuits 10 are arranged in a row and as close as possible to one another. The input/output circuits 10 are each composed of a plurality of transistors and other circuit elements, and serve mainly to stabilize the signals to be output via the pads and sometimes to process in a predetermined manner the signals received via the pads. On the chip-edge side of the row of these input/output circuits 10, input/output pads 6 and 7 are arranged in two rows, and are individually connected to the corresponding input/output circuits 10 by way of metal conductors 8.

Reference numeral 9 represents conductor layers that are laid over the input/output circuits 10 so as to serve as power-source and ground conductors. To make the layout clearer, a portion 30 of FIG. 1 is illustrated in more detail in FIG. 2. Note, however, that the conductor layers 9 are omitted in FIG. 2.

Figure 2:
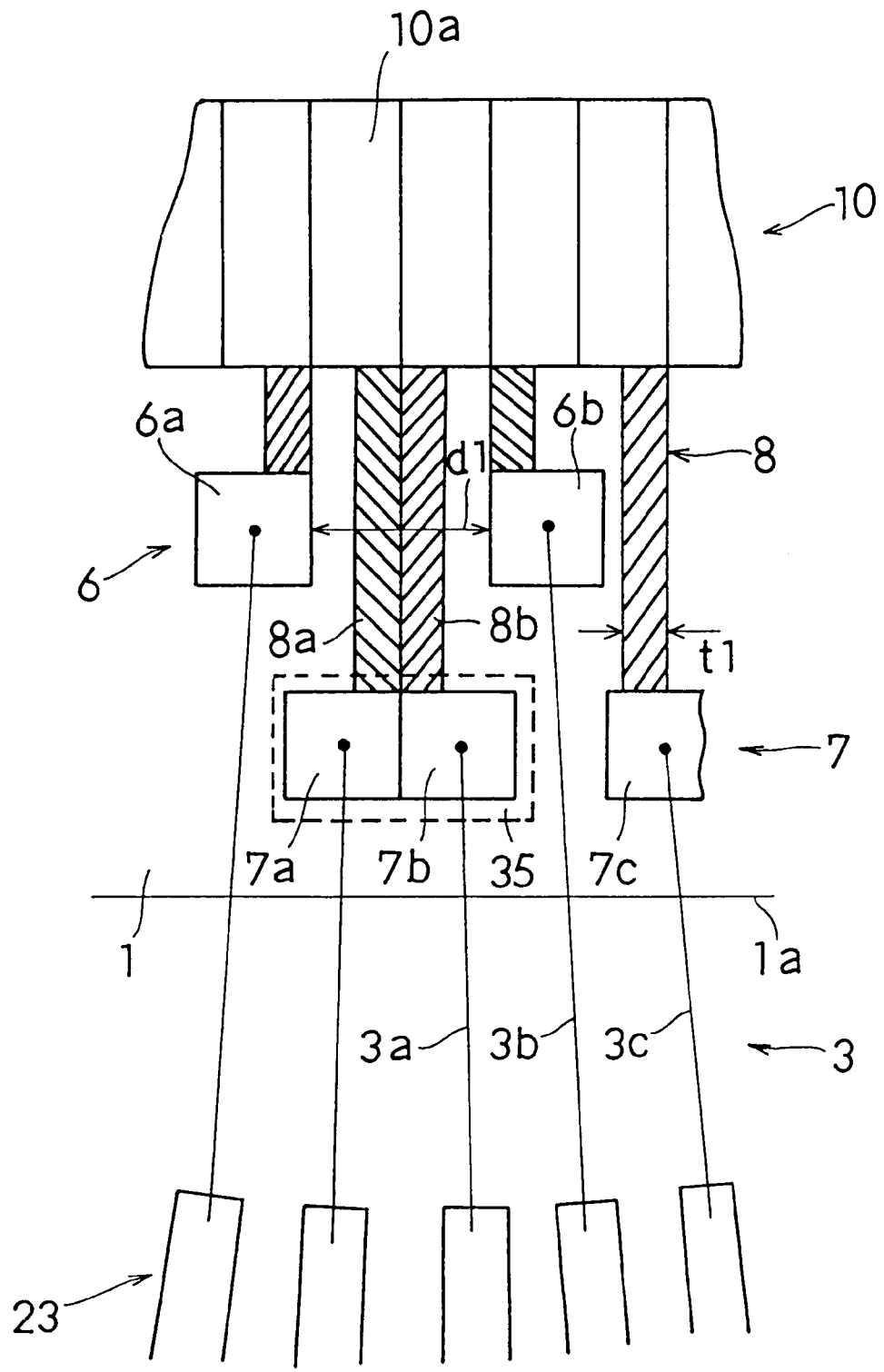
FIG. 2 is an enlarged view of a portion of the semiconductor integrated circuit device shown in FIG. 1.

In FIG. 2, the input/output pads 7 that are arranged in the chip-edge-side row are grouped into groups of pads each consisting basically of two pads, as exemplified by the pads 7a and 7b forming a group 35 of pads. Note that, although the pads 7a and 7b appear to be in contact with each other in the figure, actually they are arranged with a sufficient space between them to keep them out of contact, and that a similar space is secured also between the metal conductors 8a and 8b. The groups of pads are arranged with predetermined spaces between them.

Figure 10:
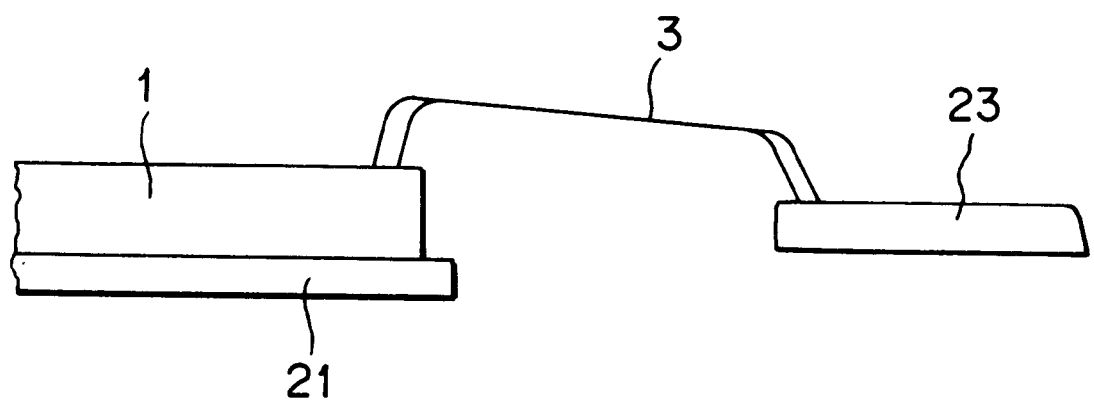
FIG. 10 is a side view of a relevant portion of the semiconductor integrated circuit device of the embodiments of this invention.

On the other hand, the input/output pads 6 that are arranged in the chip-center-side row are arranged individually, i.e. without forming any group, as exemplified by the pads 6a and 6b. These input/output pads 6 and 7 are individually connected to the inner leads 23 by way of wires 3 that are wire-bonded to them. Accordingly, it is possible to arrange the wires 3 without any intersection among them; that is, the wires 3 can be arranged not in two layers but in one laser. See FIG. 10.

For example, the pads 7b and 7c are arranged with a predetermined space between them so that the wire 3b connecting to the pad 6b may be so arranged as to pass between the wires 3a and 3c connecting to the pads 7b and 7c and extend further inward. In this way, the positions of the input/output pads 6 and 7 are so determined that the wires 3 are arranged in one layer.

The reason why, in the chip-edge-side row, the pads 7 are grouped into groups each consisting basically of two pads is as follows. To achieve connection between the pads 7 (i.e. 7a, 7b, . . . ) and the output buffers of the input/output circuits 10 (10a, . . . ), for example, by way of metal conductors 8 (i.e. 8a, 8b, . . . ), it is inevitable that the conductors 8 are arranged through the spaces that exist between the pads 6. In general, the narrower the width t1 of the metal conductors 8, the lower the current-feeding capacity of the input/output circuits 10, and therefore it is preferable to use as wide a width t1 as possible.

Figure 3:
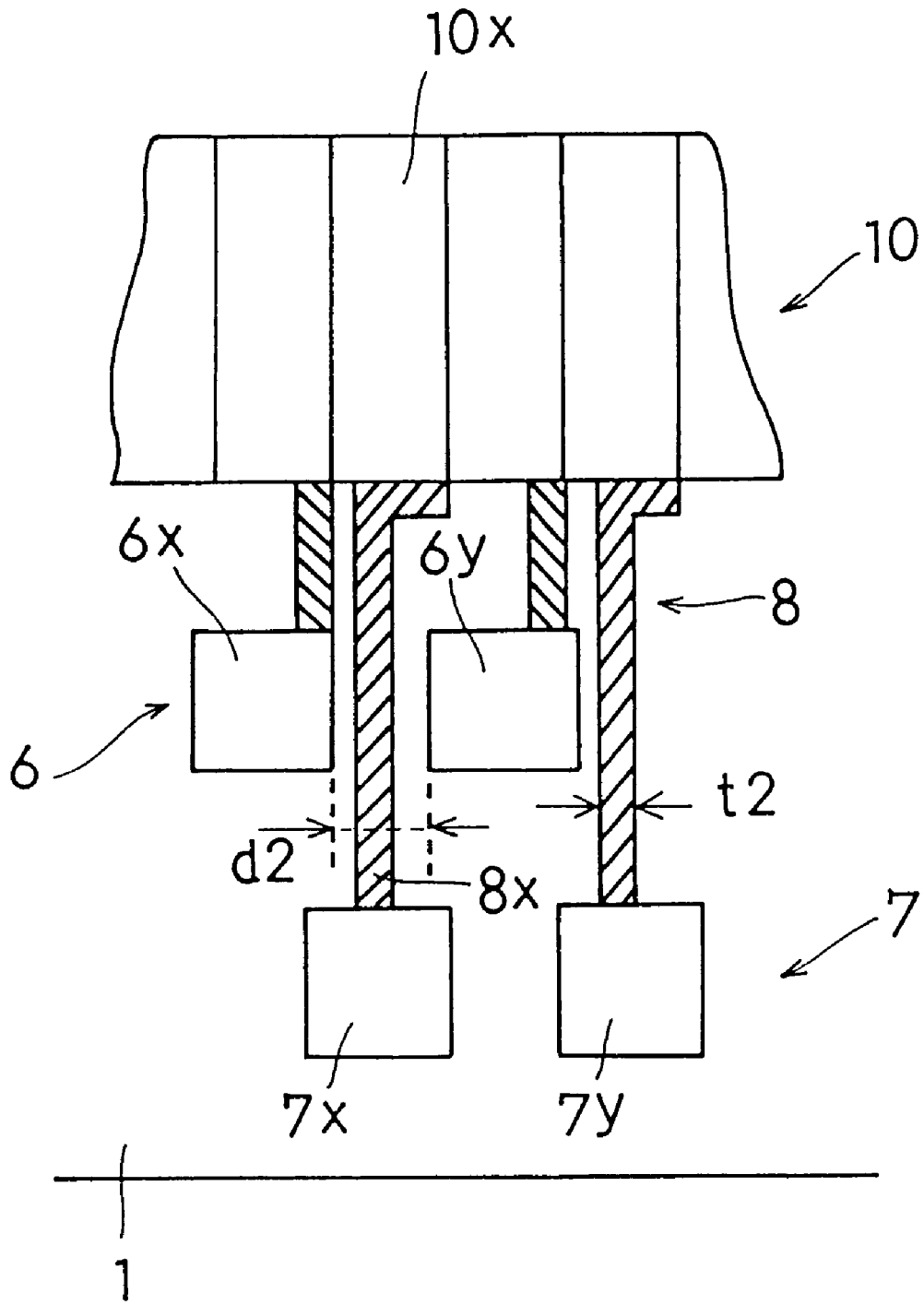
FIG. 3 is an enlarged view of the same portion as shown in FIG. 2, illustrating the case where pads 6 and 7 are arranged alternately.

If, as shown in FIG. 3, the pads 6 and 7 are arranged one by one alternately, the gap d2 between the pads 6x and 6y will be narrower, and thus the metal conductor 8x connecting the pad 7x to the input/output circuit 10x will need to have an accordingly narrower width t2. This may cause a serious problem near a corner of the semiconductor chip 1, because the metal conductors 8 are longer there.

By contrast, in the embodiment under discussion (FIG. 2), where two pads 7a and 7b are arranged as one group 35 of pads, the gap d1 between the pads 6b and 6c is wider, and the metal conductors 8 can have an accordingly wider width t1 than the width t2 shown in FIG. 3.

In this way, the input/output pads 6 and 7 are arranged as shown in FIG. 1, and are individually connected to the input/output circuits 10 by way of the metal conductors 8. Near a corner of the semiconductor chip 1, three pads 7 form a group of pads as indicated at 31. This is because, near a corner, by arranging a pad that theoretically belongs to the row of the chip-center-side pads 6 exceptionally in the row of the chip-edge-side pads 7, it is possible to secure an ample space for the metal conductors 8. This helps reduce the chip size and in addition, by allowing the wires 3 to be made shorter, helps increase the reliability of the semiconductor integrated circuit device.

Figure 7:
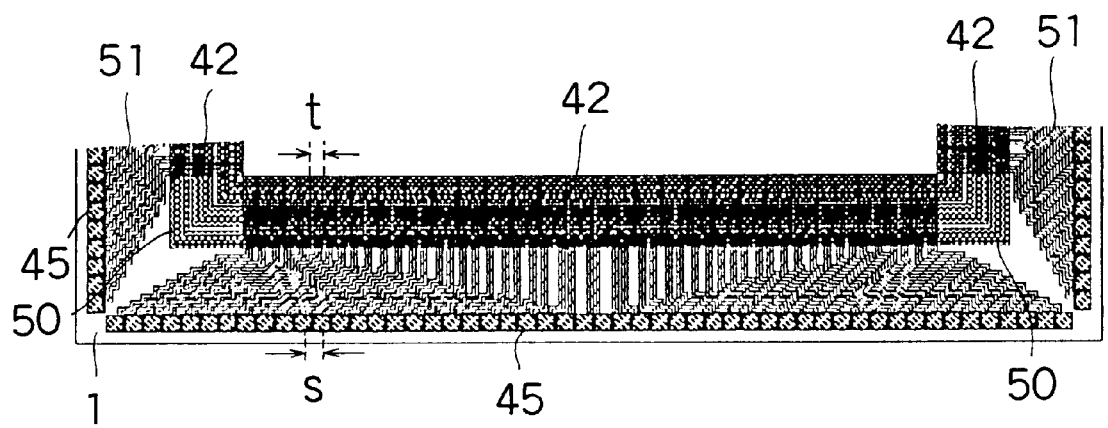
FIG. 7 is a plan view of a relevant portion of another conventional semiconductor integrated circuit device in which pads are arranged in a single row.
Figure 8:
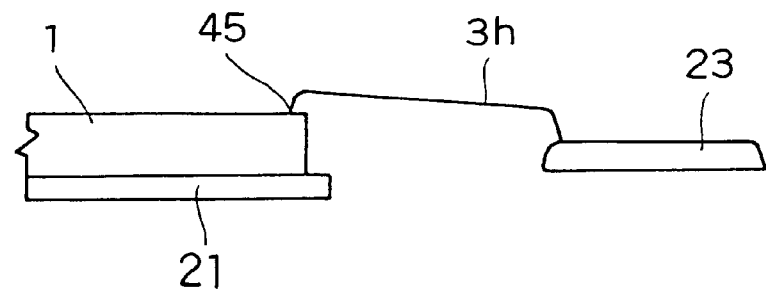
FIG. 8 is a side view of a relevant portion of the conventional semiconductor integrated circuit device shown in FIG. 7.

As described above, according to this embodiment, the input/output pads 6 and 7 are arranged in two rows. Thus, when a large number of pads are involved, it is possible to arrange the same number of pads on a semiconductor chip of a smaller size as compared with the conventional semiconductor integrated circuit device (FIG. 7) described earlier in which the pads are arranged in a single row. Note that, although only the portion along one edge of the semiconductor chip 1 is shown in FIG. 1, the portions along the other edges have similar layouts.

Assume that the "pad pitch" refers to the value obtained by dividing the size of a chip by the number of pads that can be arranged thereon. Then, the semiconductor chip of the embodiment under discussion requires only 90% of the pad pitch that is required in the conventional semiconductor chip shown in FIG. 7. That is, as compared with the conventional semiconductor integrated circuit device (FIG. 7) described earlier, this embodiment allows a larger number of input/output pads to be arranged in a semiconductor chip of a given chip size.

Figure 5:
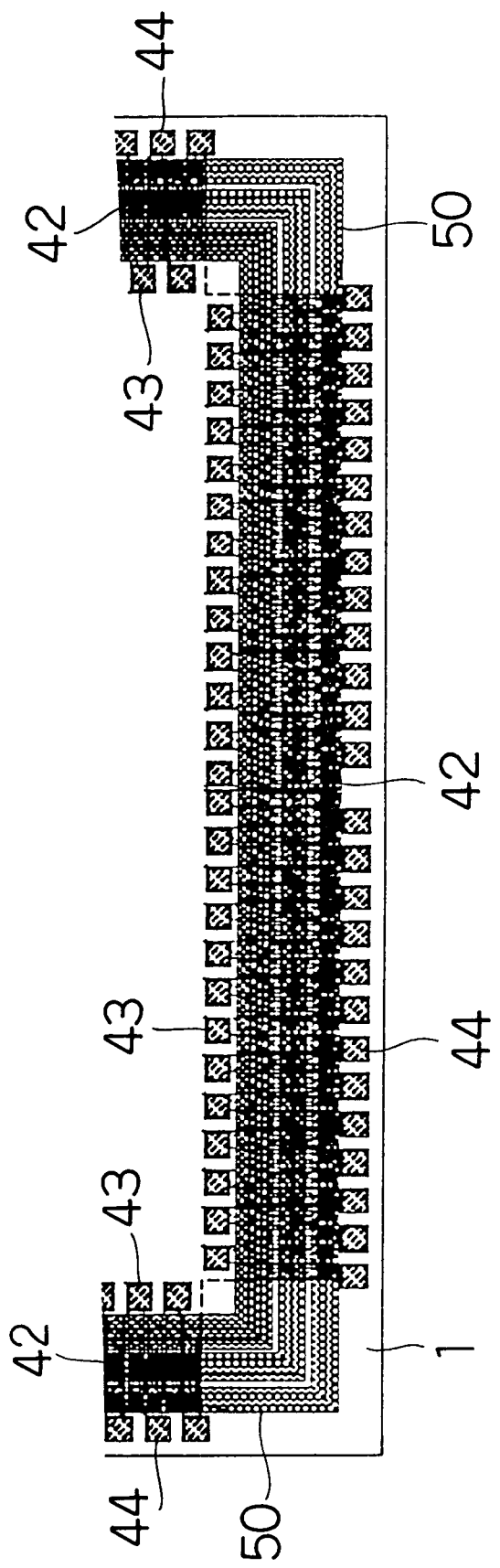
FIG. 5 is a plan view of a relevant portion of a conventional semiconductor integrated circuit device in which pads are arranged in a staggered arrangement.
Figure 6:
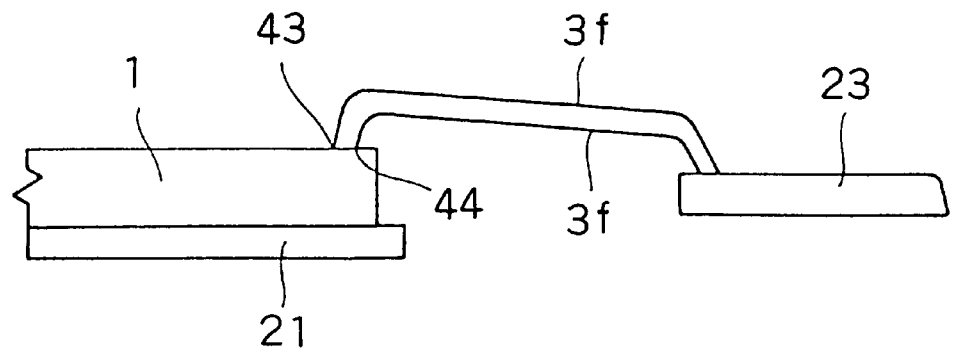
FIG. 6 is a side view of a relevant portion of the conventional semiconductor integrated circuit device shown in FIG. 5.

Moreover, in this embodiment, the wires 3 are arranged in one layer, and therefore there is no need to increase the thickness of the package as required by the conventional semiconductor integrated circuit device (FIG. 5) described earlier in which the pads are arranged in a staggered arrangement. As a result, this embodiment, by reducing the pad pitch, helps reduce the production cost, and, by preventing the thickening of the package, finds applications even in small-size appliances such as a portable telephone.

In this embodiment, the pads 7 are grouped into groups each consisting basically of two pads. However, it is also possible to group them into groups each consisting of three or more pads 7 and arrange the wires 3 through the spaces secured between such groups of pads. In this case, the effect of chip size reduction is smaller, but even this layout does achieve a certain degree of chip size reduction as compared with the semiconductor integrated circuit device shown in FIG. 7. On the other hand, this layout allows the pads 6 to be arranged with wider spaces between them and thus allows the metal conductors 8 to be made wider.

The inner leads 23 do not necessarily have to be arranged radially as shown in FIG. 9; for example, they may be so arranged that the angle w formed between a wire 3 and an edge of the semiconductor chip 1 approximately equals to 90° anywhere. Even in this case, as long as the pads are arranged in two rows as shown in FIG. 2, it is possible to reduce the chip size. In this case, however, the wires 3 need to be arranged at relatively narrow intervals on the whole, and therefore this layout is unfit for a semiconductor integrated circuit device that requires an extremely large number of wires.

Figure 4:
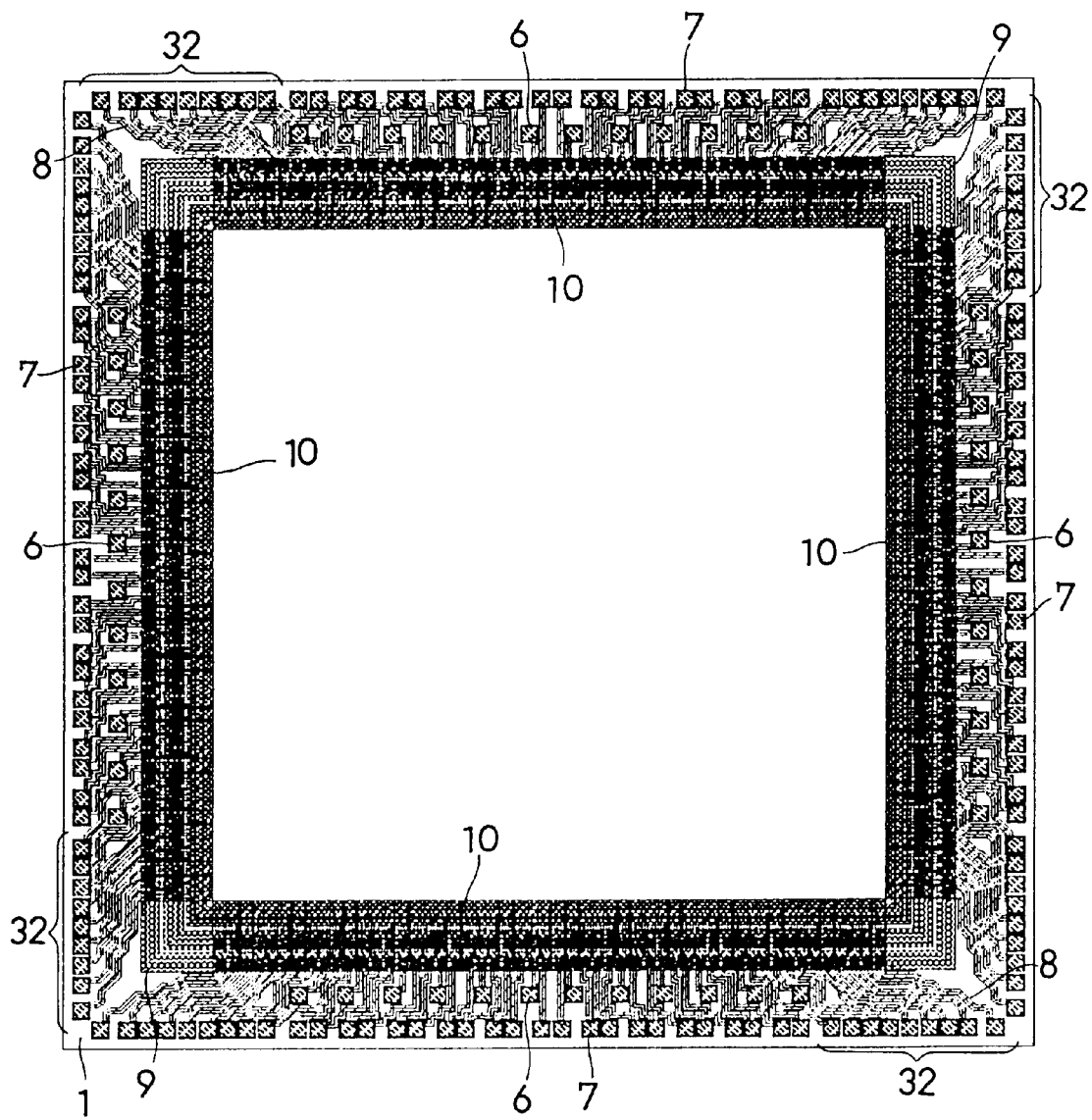
FIG. 4 is a plan view of a relevant portion of the semiconductor chip employed in another semiconductor integrated circuit device embodying the present invention.

FIG. 4 is a plan view of a relevant portion of the semiconductor chip 1 employed in another semiconductor integrated circuit device embodying the present invention.

In this embodiment, the layout near a corner of the semiconductor chip 1 is optimized to make the chip size even smaller than in the previous embodiment.

In this embodiment, input/output pads 6 and 7 are arranged in two rows, and the pads 7 arranged in the chip-edge-side row are grouped into groups each consisting basically of two pads. The pads 6 arranged in the chip-center-side row are arranged between the row of the chip-edge-side pads 7 and the output buffers of input/output circuits 10 in such a way that wires can be arranged through the spaces secured between those groups of pads.

Near a corner of the semiconductor chip 1, however, the pads in the chip-edge-side row are grouped into groups each consisting of nine pads, as exemplified by the groups 32 of pads. This helps prevent some pads from obstructing the metal conductors 8 arranged near a corner, where the conductors 8 tend to be longer than elsewhere. This makes effective use of the area near a corner possible, and thereby helps reduce the chip size further.

What is claimed is:

1. A semiconductor integrated circuit device comprising:

a plurality of input/output circuits arranged to form a row in input/output circuits along each edge of a semiconductor chip; and input/output pads arranged between the row of input/output circuits and the edge of the semiconductor chip to form a first and a second row of input/output pads, the first row of input/output pads being located beside the edge of the semiconductor chip, the second row of input/output pads being located beside the row of input/output circuits, the input/output pads of the first and second rows of input/output pads being connected to the input/output circuits, wherein, in the first row of input/output pads, the input/output pads are grouped into groups each consisting of a plurality of input/output pads, with those groups arranged with spaces between them so that wires can be arranged through those spaces, and, in the second row of input/output pads, the input/output pads are arranged in such positions where they are connected to the wires arranged through those spaces, wherein, within each group, the input/output pads are arranged at intervals far shorter than a width of the spaces, wherein the device has inner leads that are connected by way of wires to the input/output pads, and wires connecting the input/output pads in the first row to inner leads and wires connecting the input/output pads in the second row to inner leads are all arranged at an identical height.

2. A semiconductor integrated circuit device as claimed in claim 1, wherein those of the groups of input/output pads which are located near a corner of the semiconductor chip include a larger number of input/output pads than those which are located away from a corner of the semiconductor chip.

* * * * *